United States Patent
Püschner et al.

(10) Patent No.: US 6,557,769 B2
(45) Date of Patent: May 6, 2003

(54) SMART CARD MODULE, SMART CARD WITH THE SMART CARD MODULE, AND METHOD FOR PRODUCING THE SMART CARD MODULE

(75) Inventors: Frank Püschner, Kelheim (DE); Erik Heinemann, Regensburg (DE); Jürgen Fischer, Deuerling (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/083,039

(22) Filed: Feb. 26, 2002

(65) Prior Publication Data

US 2002/0113131 A1 Aug. 22, 2002

Related U.S. Application Data

(63) Continuation of application No. PCT/DE00/02898, filed on Aug. 24, 2000.

(30) Foreign Application Priority Data

Aug. 26, 1999 (DE) .......................... 199 40 564

(51) Int. Cl.[7] .............................. G06K 19/06
(52) U.S. Cl. .................. 235/492; 235/383; 257/778; 257/737
(58) Field of Search ................. 235/492; 257/778, 257/737

(56) References Cited

U.S. PATENT DOCUMENTS 6,291,893 B1 * 9/2001 Tiziani et al. ............... 257/706
6,313,522 B1 * 11/2001 Akram et al. ............... 257/686
6,344,696 B2 * 2/2002 Nakamura et al. .......... 257/668
6,348,738 B1 * 2/2002 Dery et al. .................. 257/734
6,404,063 B2 * 6/2002 Farnworth et al. .......... 257/723
6,407,456 B1 * 6/2002 Ball ............................ 257/686
6,410,415 B1 * 6/2002 Estes et al. .................. 257/778

FOREIGN PATENT DOCUMENTS

| DE | 44 41 052 A1 | 5/1996 |
| DE | 195 32 755 C1 | 2/1997 |
| DE | 196 00 388 A1 | 9/1997 |
| DE | 196 39 934 A1 | 4/1998 |
| DE | 197 08 617 A1 | 9/1998 |
| EP | 0 772 232 A1 | 5/1997 |
| EP | 0 930 651 A1 | 7/1999 |
| JP | 409260534 A * | 10/1997 |
| WO | WO 99/19832 | 4/1999 |

* cited by examiner

Primary Examiner—Michael G. Lee
Assistant Examiner—Allyson Sanders
(74) Attorney, Agent, or Firm—Laurence A. Greenberg; Werner H. Stemer; Ralph E. Locher

(57) ABSTRACT

Flip-chip bumps (solder bumps) are applied on the contact-connection points of a semiconductor chip. These bumps extend from there through a covering compound (mold) that is applied as a protective layer. The end of each one of the bumps that is remote from the semiconductor chip forms a pad. This pad lies approximately plane-parallel in the surface of the covering compound that is remote from the semiconductor chip. At least during the encapsulation process, the chips are preferably arranged on a carrier element, in particular a carrier strip.

17 Claims, 2 Drawing Sheets

SMART CARD MODULE, SMART CARD WITH THE SMART CARD MODULE, AND METHOD FOR PRODUCING THE SMART CARD MODULE

CROSS-REFERENCE TO RELATED APPLICATION

This application is a continuation of copending International Application No. PCT/DE00/02898, filed Aug. 24, 2000, which designated the United States.

BACKGROUND OF THE INVENTION

Field of the Invention

The invention relates to a smart card module including a semiconductor chip that is electrically conductively contact-connected to a connection plane in which contact areas are formed. At least one side of the semiconductor chip is provided with an electrically insulating protective layer. Pads are formed on the surface of the protective layer that is remote from the semiconductor chip, and these pads are electrically conductively connected to the contact-connection points of the semiconductor chip. The semiconductor chip is arranged with the pads first on the connection plane and is electrically conductively contact-connected to the contact areas via the pads. Moreover, the invention relates to a method for producing such a smart card module, and also to a smart card including such a smart card module.

Smart card modules usually include a carrier, for example a laminated plastic film or a metallic connection lead frame, on which a semiconductor chip is fixed. The conductive layers or constituents of the carrier are patterned to form individual contact areas that can be tapped using a card reader. The form and size of the contact areas, which are usually arranged in a connection plane, generally depend on particular standard specifications such as, for example, ISO Standard 7816. In conventional smart card modules, semiconductor chips and contact areas are electrically contact-connected using bonding wires that are led from the contact-connection points of the semiconductor chip to the connection points of the contact areas. As an alternative, the semiconductor chip can be applied using flip-chip technology.

In order to protect the chip and the connections to the contact areas, a layer made of epoxy resin, thermosetting plastic, or the like is applied above the chip and the connecting points. The finished smart card module, which generally has a component height of at least 500–600 $\mu$m, is finally implanted into the card carrier of a smart card.

Published German Patent Application DE 197 08 617 A1 discloses a smart card module of the type mentioned in the introduction in which the semiconductor chip is not incorporated as an initially "naked" chip (as described above), and housed only afterward, that is to say in the smart card module, but rather is incorporated as a so-called die size package, nowadays usually called a chip size package (CSP). These packages are already provided with a protective layer and with pads and permit smaller module thicknesses. In this case, for mounting, it is also known to use a connection lead frame strip from which the individual smart card modules are separated only after the positioning, placement, and contact-connection of the die size packages—evidently assumed to be finished—on the respective contact areas.

There are many options for producing and constructing such specially housed chips or for integrating their production into the mounting sequence of the smart card modules, the advantages and disadvantages of these options have to be balanced. In the course of the increasingly greater functional diversity and the chips that thus become ever larger, not only the demands for smaller module thicknesses increase, but also the demands placed on the mechanical robustness. With CSP-like housings becoming larger, which would be coupled to a connection lead frame strip during production, the utilization of the carrier strip and the injection machine would inevitably also become poorer.

SUMMARY OF THE INVENTION

It is accordingly an object of the invention to provide a smart card module, a smart card with the smart card module, and a method for producing the smart card module which overcome the above-mentioned disadvantages of the prior art apparatus and methods of this general type.

In particular, it is an object of the invention to provide a smart card module of the type mentioned in the introduction that can be produced simply and effectively and that has small component dimensions. The semiconductor chip should also be well protected against mechanical damage and chemical influences. The invention also includes a method for producing such a smart card module in a fabrication-optimized manner. Moreover, the smart card module should be able to be incorporated into a smart card.

With the foregoing and other objects in view there is provided, in accordance with the invention, a chip element including a semiconductor chip for electrically conductively contact-connecting a connection plane in which contact areas are formed. The semiconductor chip has sides and contact-connection points. The chip element includes an electrically insulating protective layer located on at least one of the sides of the semiconductor chip. The electrically insulating protective layer has a surface that is remote from the semiconductor chip. The chip element includes pads formed on the surface of the electrically insulating protective layer that is remote from the semiconductor chip. The chip element includes flip-chip bumps that electrically conductively connect the pads to the contact-connection points of the semiconductor chip. The semiconductor chip and the electrically insulating protective layer can be configured such that the pads are first on the connection plane and such that the pads can electrically conductively contact-connect the semiconductor chip to the contact areas. The electrically insulating protective layer is applied only around the semiconductor chip. The flip-chip bumps extend through the electrically insulating protective layer. Each one of the flip-chip bumps has an end that is remote from the semiconductor chip. The end of each one of the flip-chip bumps forms a pad lying approximately plane-parallel in the surface of the electrically insulating protective layer that is remote from the semiconductor chip. The electrically insulating protective layer is a covering compound.

In accordance with an added feature of the invention, the covering compound has a thickness; and the flip-chip bumps are embodied as stud bumps made of a ductile material that has been compressed to have a thickness equal to the thickness of the covering compound by an injection mold that has injected the covering compound.

In accordance with an additional feature of the invention, the ductile material contains gold.

With the foregoing and other objects in view there is also provided, in accordance with the invention, a smart card module that includes: a connection lead frame forming a connection plane, the connection lead frame having contact areas; and a chip element placed onto the connection lead frame. The chip element includes a semiconductor chip electrically conductively contact-connected to the connection plane in which contact areas are formed. The semiconductor chip has sides. The semiconductor chip has contact-connection points. The chip element includes an electrically insulating protective layer located on at least one of the sides of the semiconductor chip. The electrically insulating protective layer has a surface that is remote from the semiconductor chip. The chip element includes pads formed on the surface of the electrically insulating protective layer that is remote from the semiconductor chip. The chip element includes flip-chip bumps electrically conductively connecting the pads to the contact-connection points of the semiconductor chip. The semiconductor chip and the electrically insulating protective layer are configured such that the pads are first on the connection plane and such that the pads electrically conductively contact-connect the semiconductor chip to the contact areas. The electrically insulating protective layer is applied only around the semiconductor chip. The flip-chip bumps extend through the electrically insulating protective layer. Each one of the flip-chip bumps has an end that is remote from the semiconductor chip. The end of each one of the flip-chip bumps forms a pad lying approximately plane-parallel in the surface of the electrically insulating protective layer that is remote from the semiconductor chip. The electrically insulating protective layer is a covering compound. The pads of the chip element are connected to the contact areas of the connection lead frame by either being soldered or being electrically conductively adhesively bonded.

With the foregoing and other objects in view there is also provided, in accordance with the invention, a smart card module that includes a smart card body formed with a cavity. The smart card body has contact areas forming a connection plane. The smart card module has a chip element including a semiconductor chip electrically conductively contact-connected to the connection plane in which contact areas are formed. The semiconductor chip has sides. The semiconductor chip has contact-connection points. The chip element includes an electrically insulating protective layer that is located on at least one of the sides of the semiconductor chip. The electrically insulating protective layer has a surface that is remote from the semiconductor chip. The chip element includes pads formed on the surface of the electrically insulating protective layer that is remote from the semiconductor chip. The chip element includes flip-chip bumps electrically conductively connecting the pads to the contact-connection points of the semiconductor chip. The semiconductor chip and the electrically insulating protective layer are configured such that the pads are first on the connection plane and such that the pads electrically conductively contact-connect the semiconductor chip to the contact areas. The electrically insulating protective layer is applied only around the semiconductor chip. The flip-chip bumps extend through the electrically insulating protective layer. Each one of the flip-chip bumps has an end that is remote from the semiconductor chip. The end of each one of the flip-chip bumps forms a pad lying approximately plane-parallel in the surface of the electrically insulating protective layer that is remote from the semiconductor chip. The electrically insulating protective layer is a covering compound. The chip element is inserted into the smart card body such that the pads are on top. The contact areas are connected to the pads by either being sputtered on the pads or by being printed on the pads.

With the foregoing and other objects in view there is also provided, in accordance with the invention, a method for producing a smart card module that includes steps of: providing a semiconductor chip having contact-connection points and an underside located opposite the contact-connection points; fixing the underside of the semiconductor chip to a carrier element; applying flip-chip bumps made of a ductile material on the contact-connection points of the chip, and subsequently: transporting the chip with the bumps into an open injection mold having an upper mold half with an areally designed inner wall that faces the bumps, and subsequently: closing the injection mold such that the inner wall compresses ends of the bumps that are remote from the chip to form pads in a plane at a height that corresponds to a thickness of a plastic covering compound that will be injected on top of the chip; injecting the plastic covering compound into the closed injection mold to encapsulate the chip and the bumps down to the carrier element, and performing the injecting such that the ends of the bumps that are remote from the chip and that have been compressed are not encapsulated with the plastic covering compound, and subsequently: providing contact areas in a connection plane and contact-connecting the contact areas to the pads.

In accordance with an added mode of the invention, the flip-chip bumps are provided as stud bumps.

In accordance with an additional mode of the invention, a carrier strip is used as the carrier element.

In accordance with another mode of the invention, a contact carrier strip is used to provide the contact areas; and the carrier element is used to bring the chip that has been encapsulated with the covering compound and the contact carrier strip together.

In accordance with a further mode of the invention, after the injecting step, the carrier element is removed.

In accordance with a further added mode of the invention, a carrier strip is used as the carrier element.

In accordance with a further additional mode of the invention, the carrier element is provided with a hole that is situated below the chip; and an ejector is plunged through the hole to detach the chip from the carrier element.

In accordance with yet an added mode of the invention, a carrier lead frame is used as the carrier element.

In accordance with yet an additional mode of the invention, a carrier lead frame strip is used as the carrier element.

With the foregoing and other objects in view there is also provided, in accordance with the invention, a smart card that includes the smart card module.

A smart card module of the type mentioned in the introduction having small component dimensions can be produced simply and effectively by applying flip-chip bumps (solder bumps) on the contact-connection points. These bumps extend from there through the covering compound (mold) that is applied as a protective layer. The remote end of each one of the bumps, i.e the end that is remote from the semiconductor chip, forms a pad lying approximately plane-parallel in the surface of the covering compound that is remote from the semiconductor chip.

A method for producing such a smart card module, is distinguished by the fact that:

the semiconductor chip is fixed by its underside, which is opposite the contact-connection points, on a carrier element, and the flip-chip bumps, in particular stud bumps, made of ductile material are applied on the contact-connection points of the chip, the chip with the bumps is subsequently transported into an open injection mold, whose upper mold half includes an areally designed inner wall facing the bumps, this inner wall, when the injection mold is subsequently closed, compresses the ends of the bumps that are remote from the chip to a height which corresponds to the thickness of the covering compound that will be injected on the top side of the chip, a plastic is injected into the closed injection mold, the chip and the bumps, but not their plane-pressed ends forming pads, are encapsulated down to the carrier element with the covering compound, and in the further course of events, the contact areas of the connection plane are provided and contact-connected to the pads.

The invention is first based on the fact that only the chip itself is covered. Accordingly, the protective layer or the housing is barely larger than the chip itself, and is thus extremely robust. On the other hand, the disentanglement and provision of the contact areas can be effected at a later point in time. This decoupling enables the carrier strip (for the chips to be encapsulated) and the multi-plunger (multiple injection-molding apparatus) to be optimally utilized. The number of modules/machine cycle is greater by a multiple. About 300 chips can be covered simultaneously per shot.

The contact areas can be provided later either in the smart card by using sputtered or printed contact areas, or by placing the CSP onto a metal lead frame produced by stamping or etching. The contact-connection is not effected using wire bonds, but by using flip-chip bumps. The bumps can be applied by all customary methods in flip-chip technology. According to the invention, a stud bump known per se is advantageously applied. To that end, it is possible to use e.g. a gold wire. The stud bump can be applied with a height of approximately 70–80 $\mu$m. During molding, the bump is compressed to approximately 20 $\mu$m. This produces, on the one hand, the desired plane-pressed pad, and at the same time, a sealing area in order to prevent so-called bleed and flush on the Au surface. The remaining displaced material forms the connection pad for the contact with the contact area.

Other features which are considered as characteristic for the invention are set forth in the appended claims.

Although the invention is illustrated and described herein as embodied in a smart card module, a smart card with the smart card module, and method for producing the smart card module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
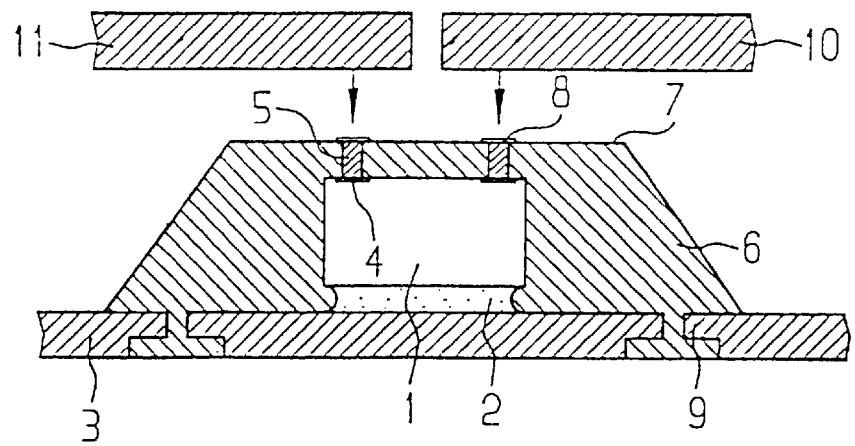
FIG. 1 is a diagrammatic cross-sectional view of a smart card module.

Referring now to the figures of the drawing in detail and first, particularly, to FIG. 1 thereof, there is shown a smart card module including a semiconductor chip 1 that is bonded onto a carrier strip 3 by an adhesive 2. The chip 1 and the bumps 5 that have been applied on the top-side contact-connection points 4 of the chip 1 are illustrated in a state in which they are already completely covered. The upper ends of the bumps 5, which are pressed flat during the covering process (see further below), lie plane-parallel in the surface 7 of the covering compound 6 that is remote from the chip 1. In each case, the upper end of a bump 5 forms a pad 8.

Since the carrier strip 3, embodied here as a lead frame for example, only serves as a carrier material for the housing of the chip 1, it is equally possible to use a carrier element made of plastic, provided that the plastic carrier element is suitable for the covering process. However, the carrier strip 3 embodied as a metal lead frame as shown in FIG. 1 provides the additional advantage that, as illustrated in FIG. 1, it can be provided with embossing 9 on the rear side. As a result, the covering compound 6 adheres to the top side of the carrier strip 3, and in addition is mechanically anchored even better on the carrier strip 3. As shown in FIG. 1, the smart card module can be completed from the top side with sputtered contact areas 10 and 11, which only for the sake of illustration, are shown at a distance from the surface 7, but in actual fact are arranged directly in contact with the respective pads 8. That is to say, the contact areas 10 and 11 form a connection plane adjoining the surface 7.

Figure 2:
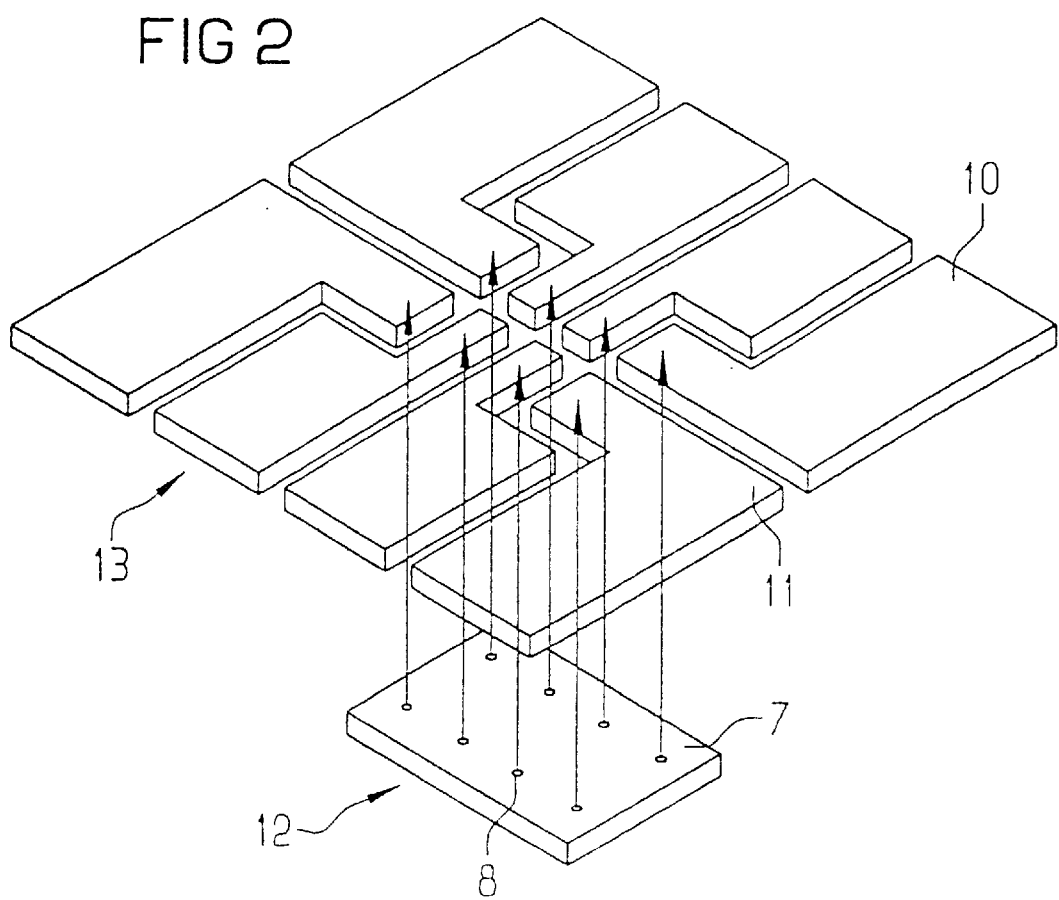
FIG. 2 is an oblique plan view of a smart card module similar to that shown in FIG. 1, but with different contact areas.

FIG. 2 shows a chip that is completely covered and whose molded surface 7 on the contact area side is permeated by eight pads 8 arranged in two rows. First, the pads 8 of this unit 12 can be placed onto the eight contact areas 10 and 11 of the shown connection lead frame 13, which can first be integrated in a contact carrier strip in the same way that the unit 12 can be integrated into a carrier strip 3 by means of its carrier element. The number and arrangement of the contact areas 10, 11 depend on the number and position of the bumps 5 or pads 8.

Figure 3:
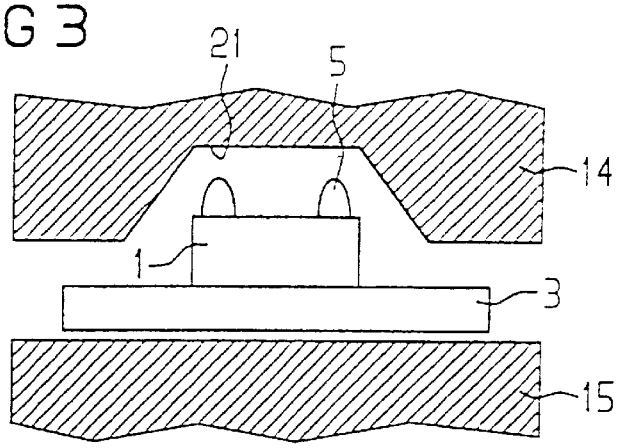
FIG. 3 is a diagrammatic cross-sectional view of an open injection mold containing an unfinished smart card module.
Figure 4:
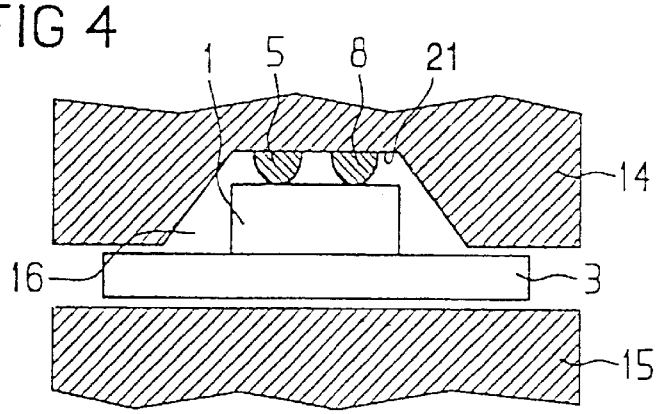
FIG. 4 is a diagrammatic cross-sectional view of a closed injection mold containing an unfinished smart card module.

FIG. 3 illustrates a chip 1 that is fixed on a carrier strip 3. The chip 1 has a top side that is provided with bumps 5. The bumps 5 initially have a height of approximately 80 $\mu$m while the chip 1 is within the still open mold halves 14, 15 of an injection mold. FIG. 4 reveals the state after closure, i.e. after the upper mold half 14 has been moved down. The bumps 5 were compressed by the inner wall 21 to a height of approximately 20 $\mu$m and were deformed on the top side, as desired, into virtually planar pads 8. The actual injection or encapsulation process is effected when the mold halves 14, 15 are in the state shown in FIG. 4. An easily flowing thermoplastic, for example, is injected at a high pressure into the interior space 16 of the injection mold formed by the mold halves 14, 15.

Since the lead frame, or more generally, the carrier strip 3 is only required during the covering process of the chip 1, the carrier strip 3 can possibly be removed later. Afterward, the housings, that is to say the units 12, can be separated using an ejector or using a roller as bulk material. The chip 1 can be linked to the carrier strip 3, for example, by an adhesive spot 17 (See FIG. 5).

Figure 5:
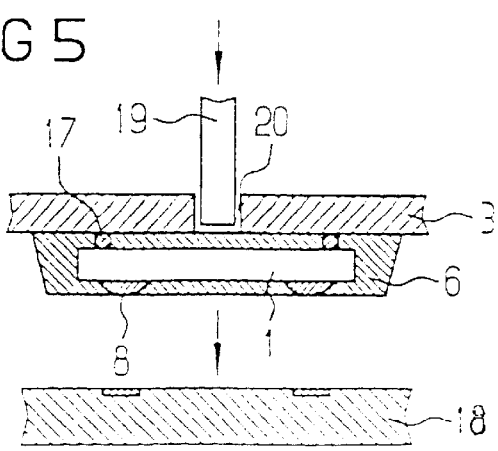
FIG. 5 is a diagrammatic cross-sectional view of a smart card module that is still fixed to a carrier strip.

As shown in FIG. 5, it is also conceivable to bring the carrier strip 3 for the chip 1 and a contact carrier strip 18 together. The housing chip (unit 12) is brought into position above the contact carrier strip 18, is ejected from the rear using an ejector 19, and is immediately afterward fixed on the contact carrier strip 18. As shown in FIG. 5, in order to minimize the ejection force, holes 20 can be provided below the chip 1 in the carrier strip 3. With large chips 1, the ejector 19 can plunge through these holes 20.

For applications requiring particularly good adhesion between the pads 8 and the contact carrier strip 18, this can be achieved by simple additional measures. On the one hand, it is possible to enlarge the housing, that is to say the surface 7 of the covering compound 6. This provides additional bonding area that can be utilized by a suitable adhesive. The adhesive is dependent on the contact carrier strip 18 chosen. However, the larger covering also slightly impairs the optimum utilization of carrier strip 3 and the multi-plunger. As an alternative, an electrodeposited coating having a thickness of approximately 20 μm may also be applied to the pads 8 in an additional process step. This requires an adhesion promoter.

The electrodeposited coating is deposited in an electroless manner. An additional sputtering process is also possible.

According to the invention, protective housings 6 result, which are barely (only approximately 0.2 mm on each side) larger than the chip 1 itself, and thus ensure optimum utilization of the carrier strip and the injection machines. The bumps are covered only partly, i.e. only on their sides that are not on the plane-pressed top sides that form pads. This ensures optimum space utilization, and at the same time, protection against damage. The bumps are shaped, as described, by the molding process to form contact pads. The inventive construction of the smart card module provides the additional advantage that the bumps are not exposed to the shear stresses that are customary in flip-chip technology. These shear stresses, which usually lead to a tearing-off in the center of the bump, are prevented by the lateral support that is provided by the covering compound.

For the production of the contact areas, it is possible, as described, on the one hand, to use the chip with the housing as a CSP (chip size package)—like module and to place it onto a contact area produced by stamping, for example. On the other hand, it is possible to insert the chip with the housing into the cavity of a smart card body and to apply the contact areas in the smart card by sputtering or printing.

We claim:

1. A chip element, comprising:
a semiconductor chip for electrically conductively contact-connecting a connection plane in which contact areas are formed, said semiconductor chip having sides, said semiconductor chip having contact-connection points;
an electrically insulating protective layer located on at least one of said sides of said semiconductor chip, said electrically insulating protective layer having a surface that is remote from said semiconductor chip;
pads formed on said surface of said electrically insulating protective layer that is remote from said semiconductor chip; and
flip-chip bumps electrically conductively connecting said pads to said contact-connection points of said semiconductor chip;
said semiconductor chip and said electrically insulating protective layer capable of being configured such that said pads are first on the connection plane and such that said pads can electrically conductively contact-connect said semiconductor chip to the contact areas;
said electrically insulating protective layer being applied only around said semiconductor chip;
said flip-chip bumps extending through said electrically insulating protective layer;
each one of said flip-chip bumps having an end that is remote from said semiconductor chip;
said end of each one of said flip-chip bumps forming a pad lying approximately plane-parallel in said surface of said electrically insulating protective layer that is remote from said semiconductor chip; and
said electrically insulating protective layer being a covering compound.

2. The chip element according to claim 1, wherein:
said covering compound has a thickness; and
said flip-chip bumps are embodied as stud bumps made of a ductile material that has been compressed to have a thickness equal to said thickness of said covering compound by an injection mold that has injected said covering compound.

3. The chip element according to claim 2, wherein said ductile material contains gold.

4. A smart card module, comprising:
a connection lead frame forming a connection plane, said connection lead frame having contact areas; and
a chip element placed onto said connection lead frame;
said chip element including:
a semiconductor chip electrically conductively contact-connected to said connection plane in which contact areas are formed, said semiconductor chip having sides, said semiconductor chip having contact-connection points,
an electrically insulating protective layer located on at least one of said sides of said semiconductor chip, said electrically insulating protective layer having a surface that is remote from said semiconductor chip,
pads formed on said surface of said electrically insulating protective layer that is remote from said semiconductor chip, and
flip-chip bumps electrically conductively connecting said pads to said contact-connection points of said semiconductor chip,
said semiconductor chip and said electrically insulating protective layer being configured such that said pads are first on said connection plane and such that said pads electrically conductively contact-connect said semiconductor chip to said contact areas,
said electrically insulating protective layer being applied only around said semiconductor chip,
said flip-chip bumps extending through said electrically insulating protective layer,
each one of said flip-chip bumps having an end that is remote from said semiconductor chip,
said end of each one of said flip-chip bumps forming a pad lying approximately plane-parallel in said surface of said electrically insulating protective layer that is remote from said semiconductor chip, and
said electrically insulating protective layer being a covering compound;
said pads of said chip element being connected to said contact areas of said connection lead frame in a manner that is selected from a group consisting of being soldered and being electrically conductively adhesively bonded.

5. A smart card module, comprising:
a smart card body formed with a cavity, said smart card body having contact areas forming a connection plane; and a chip element including:
a semiconductor chip electrically conductively contact-connected to said connection plane in which contact areas are formed, said semiconductor chip having sides, said semiconductor chip having contact-connection points,
an electrically insulating protective layer located on at least one of said sides of said semiconductor chip, said electrically insulating protective layer having a surface that is remote from said semiconductor chip,
pads formed on said surface of said electrically insulating protective layer that is remote from said semiconductor chip, and
flip-chip bumps electrically conductively connecting said pads to said contact-connection points of said semiconductor chip,
said semiconductor chip and said electrically insulating protective layer being configured such that said pads are first on said connection plane and such that said pads electrically conductively contact-connect said semiconductor chip to said contact areas,
said electrically insulating protective layer being applied only around said semiconductor chip,
said flip-chip bumps extending through said electrically insulating protective layer,
each one of said flip-chip bumps having an end that is remote from said semiconductor chip,
said end of each one of said flip-chip bumps forming a pad lying approximately plane-parallel in said surface of said electrically insulating protective layer that is remote from said semiconductor chip, and
said electrically insulating protective layer being a covering compound;
said chip element being inserted into said smart card body such that said pads are on top; and
said contact areas being connected to said pads in a manner selected from a group consisting of being sputtered on said pads and being printed on said pads.

6. A method for producing a smart card module, which comprises:
providing a semiconductor chip having contact-connection points and an underside located opposite the contact-connection points;
fixing the underside of the semiconductor chip to a carrier element;
applying flip-chip bumps made of a ductile material on the contact-connection points of the chip, and subsequently:
transporting the chip with the bumps into an open injection mold having an upper mold half with an inner wall that faces the bumps, and subsequently:
closing the injection mold such that the inner wall compresses ends of the bumps that are remote from the chip to form pads in a plane at a height that corresponds to a thickness of a plastic covering compound that will be injected on top of the chip;
injecting the plastic covering compound into the closed injection mold to encapsulate the chip and the bumps down to the carrier element, and performing the injecting such that the ends of the bumps that are remote from the chip and that have been compressed are not encapsulated with the plastic covering compound, and subsequently:
providing contact areas in a connection plane and contact-connecting the contact areas to the pads.

7. The method according to claim 6, which comprises: providing the flip-chip bumps as stud bumps.

8. The method according to claim 6, which comprises: using a carrier strip as the carrier element.

9. The method according to claim 8, which comprises:
using a contact carrier strip to provide the contact areas; and
using the carrier element to bring the chip that has been encapsulated with the covering compound and the contact carrier strip together.

10. The method according to claim 9, which comprises, after the injecting step, removing the carrier element.

11. The method according to claim 10, which comprises: using a carrier strip as the carrier element.

12. The method according to claim 10, which comprises,
providing the carrier element with a hole that is situated below the chip; and
plunging an ejector through the hole to detach the chip from the carrier element.

13. The method according to claim 12, which comprises: using a carrier strip as the carrier element.

14. The method according to claim 6, which comprises: using a carrier lead frame as the carrier element.

15. The method according to claim 6, which comprises: using a carrier lead frame strip as the carrier element.

16. A smart card, comprising:
a smart card module including:
a connection lead frame forming a connection plane, said connection lead frame having contact areas, and
a chip element placed onto said connection lead frame;
said chip element including:
a semiconductor chip electrically conductively contact-connected to said connection plane in which contact areas are formed, said semiconductor chip having sides, said semiconductor chip having contact-connection points,
an electrically insulating protective layer located on at least one of said sides of said semiconductor chip, said electrically insulating protective layer having a surface that is remote from said semiconductor chip,
pads formed on said surface of said electrically insulating protective layer that is remote from said semiconductor chip, and
flip-chip bumps electrically conductively connecting said pads to said contact-connection points of said semiconductor chip,
said semiconductor chip and said electrically insulating protective layer being configured such that said pads are first on said connection plane and such that said pads electrically conductively contact-connect said semiconductor chip to said contact areas,
said electrically insulating protective layer being applied only around said semiconductor chip,
said flip-chip bumps extending through said electrically insulating protective layer,
each one of said flip-chip bumps having an end that is remote from said semiconductor chip,
said end of each one of said flip-chip bumps forming a pad lying approximately plane-parallel in said surface of said electrically insulating protective layer that is remote from said semiconductor chip, and
said electrically insulating protective layer being a covering compound;
said pads of said chip element being connected to said contact areas of said connection lead frame in a manner that is selected from a group consisting of being soldered and being electrically conductively adhesively bonded.

17. A smart card, comprising:

a smart card module including a smart card body formed with a cavity, and a chip element;

said smart card body having contact areas forming a connection plane; and said chip element including:
- a semiconductor chip electrically conductively contact-connected to said connection plane in which contact areas are formed, said semiconductor chip having sides, said semiconductor chip having contact-connection points,
- an electrically insulating protective layer located on at least one of said sides of said semiconductor chip, said electrically insulating protective layer having a surface that is remote from said semiconductor chip,
- pads formed on said surface of said electrically insulating protective layer that is remote from said semiconductor chip, and
- flip-chip bumps electrically conductively connecting said pads to said contact-connection points of said semiconductor chip,
- said semiconductor chip and said electrically insulating protective layer being configured such that said pads are first on said connection plane and such that said pads electrically conductively contact-connect said semiconductor chip to said contact areas,
- said electrically insulating protective layer being applied only around said semiconductor chip,
- said flip-chip bumps extending through said electrically insulating protective layer,
- each one of said flip-chip bumps having an end that is remote from said semiconductor chip,
- said end of each one of said flip-chip bumps forming a pad lying approximately plane-parallel in said surface of said electrically insulating protective layer that is remote from said semiconductor chip, and
- said electrically insulating protective layer being a covering compound;

said chip element being inserted into said smart card body such that said pads are on top; and said contact areas being connected to said pads in a manner selected from a group consisting of being sputtered on said pads and being printed on said pads.

\* \* \* \* \*